US006535157B1

(12) United States Patent
Garrity et al.

(10) Patent No.: US 6,535,157 B1
(45) Date of Patent: Mar. 18, 2003

(54) LOW POWER CYCLIC A/D CONVERTER

(75) Inventors: Douglas Garrity, Gilbert, AZ (US); Patrick L. Rakers, Kildeer, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/949,245

(22) Filed: Sep. 7, 2001

(51) Int. Cl.$^7$ ............................................... H03M 1/34
(52) U.S. Cl. ........................ 341/163; 341/136; 341/155; 341/161; 341/172
(58) Field of Search ................................ 341/161, 172, 341/155, 136, 163

(56) References Cited

U.S. PATENT DOCUMENTS

| | | | | |
|---|---|---|---|---|
| 5,416,485 A | * | 5/1995 | Lee ............................. | 341/162 |
| 5,644,313 A | * | 7/1997 | Rakers et al. ................ | 341/163 |
| 5,668,549 A | * | 9/1997 | Opris et al. .................. | 341/118 |
| 5,764,176 A | * | 6/1998 | Ginetti ......................... | 341/161 |
| 5,894,284 A | * | 4/1999 | Garrity et al. ............... | 341/172 |
| 6,288,663 B1 | * | 9/2001 | Hester et al. ................ | 341/155 |

OTHER PUBLICATIONS

"A CMOS 13–b Cyclic RDS A/D Converter", Ginetti et al., IEEE Journal of Solid–State Circuits, vol. 27, No. 7, Jul. 1992, pp. 957–965.
"Micro Power 13–bit RSD A/D Converter", Grisoni et al., IEEE, pp. 510–514, 1996.
"An 8–bit Low_Power ADC Array for CMOS Image Sensors", Tanner et al., IEEE, pp. 147–150, 1998.
"A 12–b, 100ns/b, 1.9mw Switched–Current Cyclic A/D Converter", Wang et al., IEEE, pp. 1–416–1–419, 1998.
"High Speed Analog–to–Digital Converters for Embedded Applications", Garrity, AMSTC Data Converter Research.

* cited by examiner

Primary Examiner—Michael Tokar
Assistant Examiner—Linh Van Nguyen

(57) ABSTRACT

A low power cyclic RSD analog to digital converter (20) has a single RSD stage (22) that receives one of an analog input signal and a residual voltage feedback signal and converts the one selected signal to a digital output signal. The RSD stage (22) generates the residue voltage feedback signal. A first switch (32) is connected between a converter input terminal (30) and an input terminal of the RSD stage (22) for applying the analog input signal to the RSD stage input terminal. A second switch (52) is connected between an output terminal of the RSD stage (22) and the input terminal of the RSD stage. When the first switch (32) is closed, the second switch (52) is open so that the analog input signal is input to the RSD stage (22), and when the first switch (32) is open, the second switch (52) is closed so that the residual voltage feedback signal is input to the RSD stage (22). The RSD stage (22) includes a pair of comparators (34, 36) that compare the selected one of the analog input signal and the residual voltage feedback signal to predetermined high and low voltages, respectively. A logic circuit (38) connected to the comparators (34, 36) receives their outputs and generates the digital output signal based on these outputs. Use of a single stage and only two comparators conserves chip real estate.

10 Claims, 2 Drawing Sheets

-PRIOR ART-

LOW POWER CYCLIC A/D CONVERTER

FIELD OF THE INVENTION

The present invention relates to redundant signed digit (RSD) analog-to-digital converters and more particularly to a low power single stage RSD A/D converter.

BACKGROUND OF THE INVENTION

Advances in integrated circuit technology have enabled the development of complex "system-on-a-chip" ICs for a variety of applications such as wireless communications and digital cameras. Such applications are embodied in portable electronic devices for which low power and small circuit area are key design factors. Low power and low voltage circuits are needed to decrease battery power requirements, which can allow for designs requiring fewer or smaller batteries, which in turn decreases device size, weight and operating temperature.

Such devices, however, receive analog input signals that must be converted to digital signals. Various conventional cyclic (algorithmic) A/D converters that achieve low power operation and high resolution in a small area are known. For example, U.S. Pat. No. 5,644,313, herein incorporated by reference, assigned to Motorola Inc., the assignee of the present invention, discloses a cyclic RSD having two RSD stages followed by a digital logic section that performs synchronization and correction functions.

Referring to FIG. 1, a block diagram of a cyclic RSD A/D converter 10, such as the one disclosed in U.S. Pat. No. 5,644,313, is shown. The A/D converter 10 includes an analog section having two RSD stages 11 and 12 followed by digital section 14 having an alignment and synchronization block 15 and a correction block 16. An analog input signal (voltage) is input to the first RSD stage 11 by way of a switch 18. After the input signal is received, the switch 18 is opened. The first RSD stage 11 compares the input signal to a high voltage (VH) and a low voltage (VL) and generates a first digital output signal, in this case the msb, based on the comparison results. The first RSD stage 11 also generates a first residue voltage VR1. The msb is output to the digital section 14 and the residue voltage VR1 is input to the second RSD stage 12. The second RSD stage 12 also performs high and low voltage comparison operations, generates a second digital output signal (msb-1), and a second residue voltage VR2. The second digital output signal (msb-1) is output to the digital section 14, and the switch 18 is moved to connect the feedback path, and the second residue voltage VR2 is provided to the first RSD stage 11. This operation is repeated, with the RSD stages 11, 12 outputting additional digital bits of the input signal. The digital bits are aligned, synchronized, and combined in the digital section 14 to provide a standard format binary output code.

While this two-stage solution provides a low power, high resolution and high speed A/D converter, there is a need for an A/D converter having minimal power requirements, equivalent speed and decreased silicon area.

SUMMARY OF THE INVENTION

In order to provide a low power, high speed, high resolution A/D converter that does not take up a lot of space, the present invention provides a cyclic A/D converter in which a single stage is used repeatedly to perform the conversion. Low power consumption is achieved through the use of an efficient gain/addition/subtraction block that performs the same functions at the same speed as the aforementioned two-stage cyclic ADC but with approximately half the circuitry. The single stage has a directly connected feedback loop that provides a residual voltage output signal to the single stage input terminal.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1:
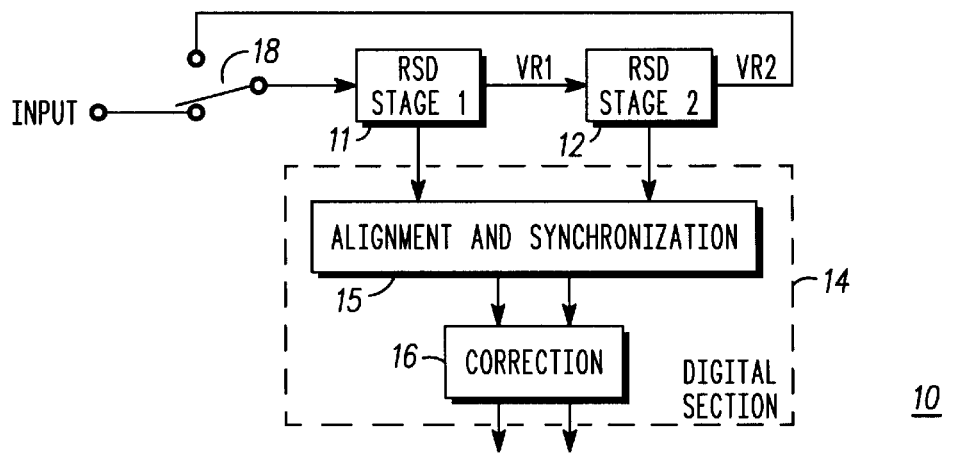
FIG. 1 is a schematic block diagram illustrating a prior art two-stage RSD analog to digital converter.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are encompassed within the spirit and scope of the invention. In the drawings, like numerals are used to indicate like elements throughout.

Figure 2:
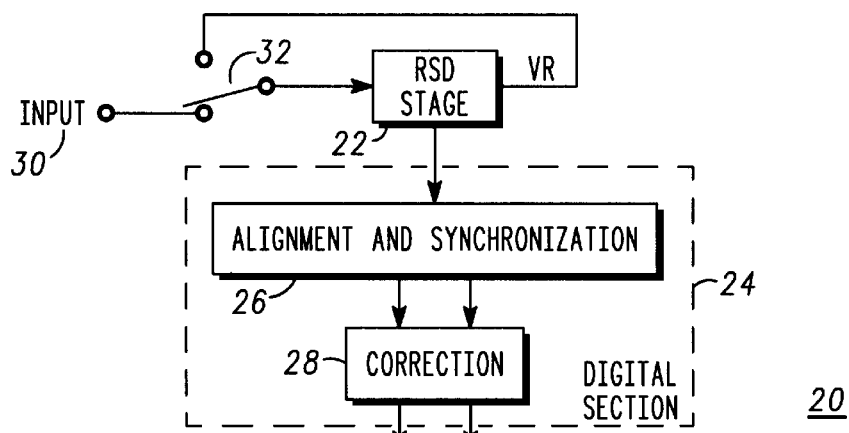
FIG. 2 is a schematic block diagram of a single stage RSD A/D converter in accordance with the present invention.

Referring now to FIG. 2, a block diagram of a cyclic A/D converter 20 in accordance with the present invention is shown. The A/D converter 20 includes a single RSD stage 22 and a digital section 24. The single RSD stage 22 is capable of maintaining the sample rate and resolution of the prior art two-stage architecture without increasing the speed of the required gain/addition/subtraction circuitry. Only the speed of the comparators is increased. The gain/addition/subtraction functions that previously required two stages are implemented with one stage through the use of an efficient architecture that does not require an increase in speed, thereby resulting in significant area and power savings.

An analog input signal is provided to the RSD stage 22 from an input terminal 30 by way of a first switch 32. The RSD stage 22 provides a digital output signal to the digital section 24. The RSD stage 22 also generates a residual voltage signal VR, which is fed back by way of the first switch 32. The first switch 32 is closed for the first cycle, in which the analog input signal is received, and then opened for the remaining number of cycles that it takes to complete converting the analog signal to a digital signal. Preferably, the feedback loop of the RSD stage 22 is directly connected from the RSD stage 22 output to the first switch 32. As is understood by those of skill in the art, the number of required cycles depends on the number of its in the digital output signal. For example, as described in more detail below, for a ten bit output signal, ten comparator clock cycles are needed, while only five gain/addition/subtraction circuitry clock cycles (10 clock phases) are needed as was the case with the original two-stage architecture.

The digital section 24, like the digital section 14 of the A/D converter 10 shown in FIG. 1, has an alignment and synchronization block 26 and a correction block 28. The digital bits output from the RSD stage 22 are provided to the digital section 24, where they are aligned, synchronized, and combined to provide a standard format binary output code. As is understood by those of ordinary skill in the art, there are a number of ways to perform the alignment and synchronization, such as taught in the aforementioned U.S. Pat. No. 5,644,313, and the present invention is not intended to be limited to any particular way.

Figure 3:
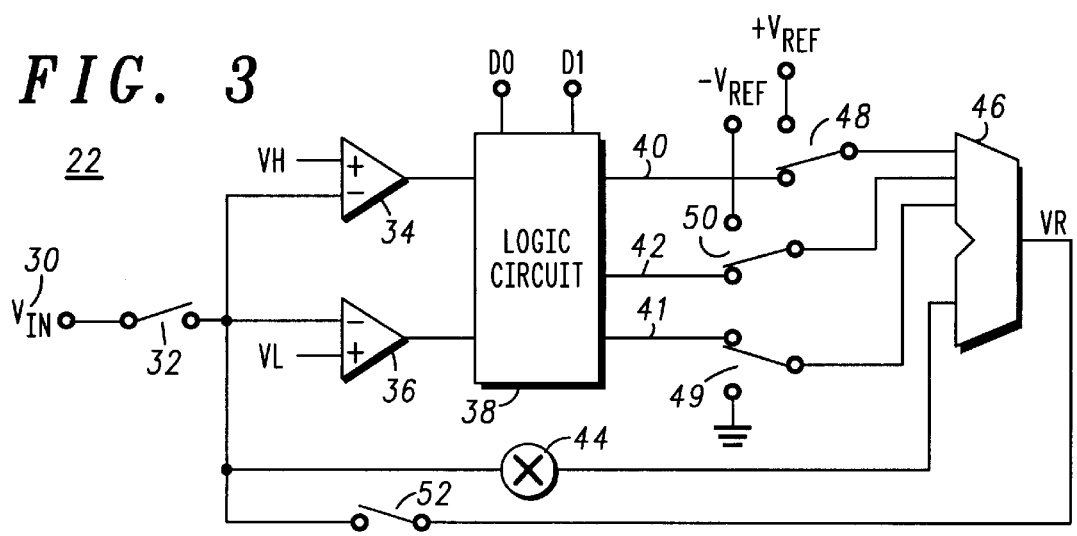
FIG. 3 is a schematic block diagram of one embodiment of the analog section of the A/D converter of FIG. 2.

Referring now to FIG. 3, a schematic block diagram of one embodiment of the RSD stage 22 is shown. The RSD stage 22 includes the input terminal 30 at which the analog input signal or voltage is applied and the first switch 32 that is used to select the analog input signal as the input to the RSD stage 22.

The RSD stage 22 further includes a first comparator 34 and a second comparator 36. The first comparator 34 has a first terminal connected to the first switch 32 that receives either the analog input signal or the residual voltage feedback signal VR and a second terminal that receives a first predetermined voltage signal. Preferably, the residual voltage feedback signal VR is provided to the first comparator 34 via a direct feedback signal path as shown in FIG. 3 (i.e., no intervening circuitry, such as a sample and hold circuit). The first comparator 34 compares the signals applied to its input terminals and generates a first comparator output signal.

The second comparator 36 also has a first terminal connected to the first switch 32 that receives either the analog input signal or the residual voltage feedback signal VR and a second terminal that receives a second predetermined voltage signal. Preferably, like the first comparator 34, the residual voltage feedback signal VR is provided to the second comparator 36 via a direct feedback signal path, with no intervening circuitry, as shown in FIG. 3. The second comparator 36 compares the selected one of the analog input signal and the residual voltage feedback signal VR to the second predetermined voltage signal and generates a second comparator output signal.

In the presently preferred embodiment, the first predetermined voltage signal is a predetermined high voltage (VH) applied to a positive input terminal of the first comparator 34 and the second predetermined voltage signal is a predetermined low voltage (VL) applied to a positive input terminal of the second comparator 36. The selected one of the analog input signal and the residual voltage feedback signal is input to a negative input terminal of the first and second comparators 34, 36. The values for VH and VL are a function of process technology since that may limit power supply voltages. However, in the presently preferred embodiment, VH is about 1.5 v and more preferably about 1.475 v, while VL is about 1.2 v and more preferably 1.225v.

The outputs of the first and second comparators 34, 36 are connected to a logic circuit 38, which receives the first and second comparator output signals and generates a two-bit digital output signal D0, D1 representative of the analog input signal. The logic circuit 38 works in the same manner as the logic circuit described in the aforementioned U.S. Pat. No. 5,644,313. For the first cycle, the raw digital output bits D0, D1 are aligned and synchronized in the digital section 24 and then combined with the digital output bits from subsequent cycles to form a standard format binary output code as discussed in more detail below. The logic circuit 38 also generates a high switch control signal 40, a mid switch control signal 41, and a low switch control signal 42 based on the first and second comparator output signals.

The RSD stage 22 also includes a gain block 44 having an input connected to the first switch 32. The gain block 44 receives the selected one of the analog input signal and the residual voltage feedback signal VR and generates a gain block output signal. In the presently preferred embodiment, the gain block 44 multiplies the voltage input thereto by a factor of 2.

A summing circuit or adder 46 is connected to the output of the gain block 44. The adder 46 generates the residual voltage feedback signal VR by adding the gain block output signal to a first reference voltage, a second reference voltage, or zero. The first and second reference voltages, or zero are selected using the high, mid and low switch control signals 40, 41, and 42 generated by the logic circuit 38. More particularly, a predetermined high reference voltage source (+Vref) is connected to the adder 46 by way of a second switch 48, a predetermined zero voltage is connected to the adder 46 by way of a third switch 49, and a predetermined low reference voltage source (−Vref) is connected to the adder 46 by way of a fourth switch 50. The second switch 48 is controlled by the high switch control signal 40, the third switch 49 is controlled by the mid switch control signal 41, and the fourth switch 50 is controlled by the low switch control signal 42. As discussed above, voltage values generally are a function of process. However, in the presently preferred embodiment, voltage Vdd is about 2.7 v, +Vref is about (2.7 v/2+0.5 v) or about 1.85 v and −Vref is about (2.7 v/2−0.5 v) or about 0.85 v.

A feedback switch 52 is provided for selecting the residual voltage feedback signal VR as an input to the gain block 44 and the first and second comparators 34, 36. The feedback switch 52 is located at a node between the inputs to the first and second comparators 34, 36, the input to the gain block 44, and the output of the adder 46. When the feedback switch 52 is closed, the first switch 32 is open so that the residual voltage feedback signal VR is input to the first and second comparators 34, 36 and the gain block gain 44. When the first switch 32 is closed, the feedback switch 52 is open so that the analog input signal is input to the gain block 44 and the first and second comparators 34, 36. As previously discussed, the first switch 32 is closed in a first cycle of converting an analog input signal and the first switch 32 is opened for subsequent cycles of converting the analog input signal.

In one embodiment of the invention, the logic circuit 38 operates in accordance with the conditions specified in Table 1.

TABLE 1

| Input Voltage | D0 | D1 | Switch 48 | Switch 50 | Switch 49 |
|---|---|---|---|---|---|
| Vin > VH | 1 | 0 | open | closed | open |
| VL < Vin < VH | 0 | 1 | open | open | Closed |
| Vin < VL | 0 | 0 | closed | open | Open |

As will be discussed in more detail below, since the A/D converter 20 has only a single RSD stage 22, the first and 'second comparators 34, 36 operate at about two times the speed of the gain block 44 and the adder 48.

Figures 4, 5:
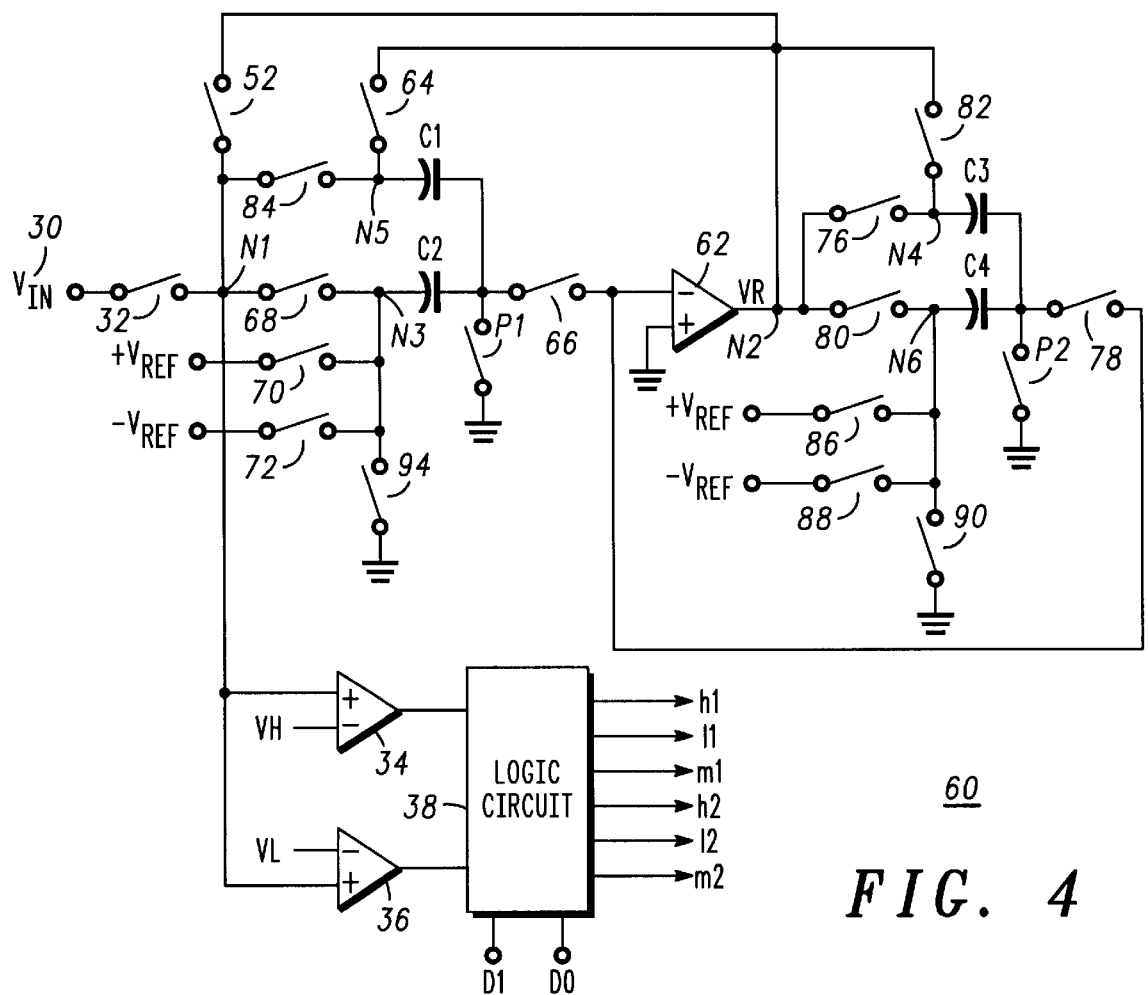
FIG. 4 is a schematic circuit diagram of the analog section of FIG. 3.
FIG. 5 is timing diagram of control signals of the analog section shown in FIG. 4.

FIG. 4 is a more detailed schematic circuit diagram of an implementation of an RSD stage 60 in accordance with a preferred embodiment of the invention. The RSD stage 60 includes the input terminal 30 that receives an analog input signal. The first switch 32 is connected between the input terminal 30 and a first node N1 for selectively applying the analog input signal to the first node N1. The feedback switch 52 is connected between the first node N1 and a second node N2 for selectively applying the residual voltage feedback signal VR to the first node N1. As previously discussed, when the first switch 32 is closed, the feedback switch 52 is open and when the first switch 32 is open, the feedback switch 52 is closed. The first switch 32 is closed in a first cycle of an A/D operation and the feedback switch 52 is closed in subsequent cycles of the A/D operation. When the feedback switch 52 is closed, a residual voltage feedback signal is applied to the first node N1.

The first comparator 34 has a positive input terminal connected to the first node N1 and a negative input terminal that receives the predetermined high voltage VH. The first comparator 34 compares a selected one of the analog input signal and the residual voltage feedback signal, as determined by the position of the first switch 32 and the feedback switch 52 to the predetermined high voltage VH, and generates a first comparator output signal. The second comparator 36 has its positive input terminal connected to the first node N1 and its negative input terminal receives the predetermined low voltage VL. The second comparator 36 compares the selected one of the analog input signal and the residual voltage feedback signal to the predetermined low voltage VL and generates a second comparator output signal.

An operational amplifier 62 has a negative input terminal coupled to the first node N1 for receiving the selected one of the analog input signal and the residual voltage feedback signal. A positive input terminal of the operational amplifier 62 is connected to ground. An output terminal of the operational amplifier 62 is connected to the second node N2. The operational amplifier 62 generates the residual voltage feedback signal VR and applies it the second node N2. As previously discussed, the residual voltage feedback signal VR preferably is provided directly from the output of the operational amplifier 62 at the second node N2 to the input of the operational amplifier 62 without an intervening sample and hold circuit.

The logic circuit 38 is connected to the first and second comparators 34, 36 and receives the first and second comparator output signals. The logic circuit 38 generates a digital output signal D0, D1 based on the first and second comparator output signals (see Table 2). The logic circuit 38 also generates a plurality of control signals h1, h2, l1, l2, m1 and m2, which are used to control the witches of the RSD stage 60. As will be understood by hose of skill in the art, the control signals h1, h2, l1, l2, m1 and m2 correspond to the high, mid and low switch control signals 40, 41, and 42 of FIG. 3.

The gain block 44 and adder circuit 46 of FIG. 3 are implemented using shared circuitry, including the operational amplifier 62 and the capacitors and switches shown in FIG. 4 and described in detail below.

A first capacitor C1 is connected to the second node N2 by way of a third switch 64 and to the negative input terminal of the operational amplifier 62 by way of a fourth switch 66. The third and fourth switches 64, 66 are controlled with a clock signal p2. A second capacitor C2 is connected to the negative input terminal of the operational amplifier 62 by way of the fourth switch 66 and to the first node by way of a fifth switch 68. The fifth switch 68 is controlled by a clock signal p1.

A sixth switch 70 is connected between a first reference voltage source (+Vref) and a third node N3 located between the second capacitor C2 and the fifth switch 68. The sixth switch is controlled by the signal h1 generated by the logic circuit 38. A seventh switch 72 is connected between a second reference voltage source (−Vref) and the third node N3. The seventh switch 72 is controlled by the signal l1 generated by the logic circuit 38. An eighth switch 74 is connected between a zero voltage or ground and the third node N3. The eighth switch 74 is controlled by the signal m1 generated by the logic circuit 38.

A third capacitor C3 is connected to the second node N2 by way of a ninth switch 76 and to the negative input terminal of the operational amplifier 62 by way of a tenth switch 78. The ninth switch 76 is controlled by clock signal p2 and the tenth switch 78 is controlled by the clock signal p1. A fourth capacitor C4 is connected to the second node N2 by way of an eleventh switch 80 and to the negative input terminal of the operational amplifier 62 by way of the tenth switch 78. The eleventh switch 80 is controlled by the clock signal p2. A twelfth switch 82 is connected between the second node N2 and a fourth node N4 located between the third capacitor C3 and the ninth switch 76. The twelfth switch 82 is controlled by the clock signal p1. A thirteenth switch 84 is connected between the feedback switch 52 and a fifth node N5, which is located between the first capacitor C1 and the third switch 64. The thirteenth switch 84 is controlled by the clock signal p1.

A fourteenth switch 86 is connected between the first reference voltage source (+Vref) and a sixth node N6 located between the eleventh switch 80 and the fourth capacitor C4. The fourteenth switch 86 is controlled by control signal h2 generated by the logic circuit 38. A fifteenth switch 88 is connected between the second reference voltage source (−Vref) and the sixth node N6. The fifteenth switch 88 is controlled by the control signal l2 generated by the logic circuit 38. A sixteenth switch 90 is connected between the sixth node N6 and ground. The sixteenth switch 90 is controlled by the control signal m2 generated by the logic circuit 38.

The input signal or residual voltage feedback is sampled on to the capacitors C1 and C2 during the time p1, as shown in FIG. 5. Then during the time p2, the sampled input signal that was previously stored on the capacitors C1 and C2 during time p1 is processed to form an output or residue signal equal to two times the input signal plus or minus the reference voltage (+Vref, −Vref) or the zero voltage.

FIG. 5 is a timing diagram showing the clock signals c1, c2, p1 and p2 of the RSD stage 60 shown in FIG. 4. The clock signals c1 and c2 are used to operate the first and second comparators 34, 36, while the clock signals p1, p2 operate the switches 64, 66, 68, 76, 78, 80, 82, and 84. The timing diagram shows that the first and second comparators 34, 36 operate at about two times the speed of the operational amplifier 62. FIGS. 4 and 5 show only four clock signals for simplicity and should in no way exclude the use of additional clock phases in the present invention. It should be noted that although only four clock signals (c1, C2, p1, and p2) are shown, it is well known to those skilled in the art that delayed versions of these signals are often applied to operate the switches that are connected to the inverting input of the operational amplifier or other critical locations to reduce errors in the sampling and residue generation process.

The single RSD stage A/D converter of the present invention has reduced power requirements and a smaller area than the prior art two-stage RSD A/D. The reduction in power and area are achieved by efficient use of a single operational amplifier included in the gain/addition block. The operational amplifier 62 is used on both phases of the clock so that no time is wasted as it was in the original two-stage architecture. Additional area or real estate savings results from re-using the comparators. In the present invention, only two comparators are required. However, since only two comparators are used, the two comparators are clocked at about twice the rate as the rest of the circuitry in the RSD stage. That is, the comparators are clocked at twice the rate as in the original two-stage ADC, while the other circuits are clocked at the same rate as the prior art circuit.

A comparison of the prior art two-stage RSD A/D converter and the single stage RSD A/D converter of the present invention is shown in Table 2.

TABLE 2

| Architecture | Two-stage | Single-stage |
| --- | --- | --- |
| Resolution | 10 bits | 10 bits |
| Sample Rate (5 or 10 MHz clock) | 2 Ms/s | 1 Ms/s |
| Supply Voltage | 3.3 v | 3.0 v |
| DNL/INL | 0.4/0.53 lsb | 0.5/0.5 lsb |
| Power | 15 mW | 1.38 mW |
| Estimated Chip Area | 0.93 mm² | 0.085 mm² |

As can be seen from Table 2, the single stage RSD A/D comparator provides 10 bits of resolution at a sample rate of 1 Ms/s. The amount of power consumed is decreased significantly from 15 mW to 1.38 mW and the chip area is decreased by a factor of 10. Such improvements are also achieved without affecting DNL and INL. DNL (differential nonlinearity) and INL (integral nonlinearity) are accuracy parameters used to measure the performance of A/D converters.

It will be understood by those of ordinary skill in the art that although the drawings show single ended circuitry for simplicity, the A/D converter is preferably implemented using fully differential circuitry throughout for improved power supply rejection and increased dynamic range. As is apparent, the present invention provides a high performance, single-stage cyclic RSD A/D converter. The single stage architecture is capable of achieving the same or better performance than the prior art two-stage RSD A/D converter and at the same time, with much less power consumption and in a smaller area. As will be appreciated, the A/D converter can be fabricated using various technologies, such as CMOS and BiCMOS. Further, the A/D converter can be used in many applications, including digital cameras and wireless communications devices. It is to be understood that this invention is not limited to the particular embodiments disclosed, but covers modifications within the spirit and scope of the present invention as defined by the appended claims.

What is claimed is:

1. A cyclic redundant signed digit (RSD) analog to digital converter, comprising:
    an input terminal for receiving an analog input signal;
    a single RSD stage connected to the input terminal for receiving a selected one of the analog input signal and a residual voltage feedback signal and converting the one selected signal to a digital output signal, wherein the RSD stage also generates the residual voltage feedback signal and returns the residual voltage feedback signal directly back to an input of the single RSD stage;
    a first switch connected between the input terminal and the RSD stage for inputting the analog input signal to the RSD stage; and
    a feedback switch connected between the input of the single RSD stage and an output of the single RSD stage wherein when the feedback switch is closed, the first switch is open so that the residual voltage feedback signal is input to the single RSD stage, and when the first switch is closed, the feedback switch is open so that the analog input signal is input to the single RSD stage;
    the RSD stage comprising:
        a first comparator connected to the first switch for comparing the selected one of the analog input signal and the residual voltage feedback signal to a predetermined high voltage and providing a first comparator output signal;
        a second comparator connected to the first switch for comparing the selected one of the analog input signal and the residual voltage feedback signal to a predetermined low voltage and providing a second comparator output signal; and
        a logic circuit connected to the first and second comparator and receiving the first and second comparator output signals and generating the digital output signal based on the first and second comparator output signals.

2. The analog to digital converter of claim 1, wherein the logic circuit further generates high, mid and low switch control signals based on the first and second comparator output signals and wherein the RSD stage further comprises:
    a gain block connected to the first switch and receiving the selected one of the analog input signal and the residual voltage feedback signal and generating a gain block output signal; and
    an adder connected to the gain block and the first and second comparators, the adder generating the residual voltage feedback signal from one of the gain block output signal, a sum of the gain block output signal and a first reference voltage, and a sum of the gain block output signal and a second reference voltage, wherein the addition of the gain block output signal with one of the first and second reference voltages or a zero voltage is determined using the high, mid and low switch control signals.

3. The analog to digital converter of claim 2, further comprising:
    a second switch connected between a first reference voltage source and the adder for selectively inputting the first reference voltage to the adder;
    a third switch connected between a substantially zero voltage and the adder for selectively inputting the zero voltage to the adder; and
    a fourth switch connected between a second reference voltage source and the adder for selectively inputting the second reference voltage to the adder, wherein the high, mid, and low switch control signals generated by the logic circuit respectively control the second, third and fourth switches.

4. The analog to digital converter of claim 3, wherein the first and second comparators operate at about two times the speed of the gain block and the adder.

5. A cyclic RSD analog to digital converter, comprising:
    an input terminal for receiving an analog input signal;
    a first switch connected between the input terminal and a first node for selectively applying the analog input signal to the first node;

a second switch connected between the first node and a second node for selectively applying a residual voltage feedback signal to the first node;

a first comparator connected to the first node for comparing a selected one of the analog input signal and the residual voltage feedback signal to a predetermined high voltage and generating a first comparator output signal;

a second comparator connected to the first node for comparing the selected one of the analog input signal and the residual voltage feedback signal to a predetermined low voltage and generating a second comparator output signal;

an operational amplifier having an input terminal coupled to the first node for receiving the selected one of the analog input signal and the residual voltage feedback signal, and an output terminal connected to the second node, wherein the operational amplifier generates the residual voltage feedback signal and applies it the second node;

a logic circuit connected to the first and second comparator and receiving the first and second comparator output signals and generating a digital output signal based on the first and second comparator output signal; and wherein when the first switch is closed, the second switch is opened so that the analog input signal is applied to the first node, and when the first switch is open, the second switch is closed so that the residual voltage feedback signal is applied to the first node.

6. The cyclic RSD analog to digital converter of claim 5, wherein the logic circuit further generates high, mid, and low switch control signals based on the first and second comparator output signals.

7. The cyclic RSD analog to digital converter of claim 6, further comprising:

a first capacitor connected to the second node by way of a third switch and to the operational amplifier input terminal by way of a fourth switch;

a second capacitor connected to the operational amplifier input terminal by way of the fourth switch and to the first node by way of a fifth switch;

a sixth switch connected between a first reference voltage source and a third node located between the second capacitor and the fifth switch;

a seventh switch connected between a second reference voltage source and the third node; and an eighth switch connected between a third reference voltage source and the third node.

8. The cyclic RSD analog to digital converter of claim 7, further comprising:

a third capacitor connected to the second node by way of an ninth switch and to the operational amplifier input terminal by way of a tenth switch, wherein a fourth node is defined at a point between the ninth switch and the third capacitor;

a fourth capacitor connected to the second node by way of an eleventh switch and to the operational amplifier input terminal by way of the tenth switch;

a twelfth switch connected between the second node and the fourth node; and a thirteenth switch connected between the first node and a fifth node, the fifth node being located at a point between the third switch and the first capacitor.

9. The cyclic RSD analog to digital converter of claim 8, further comprising:

a fourteenth switch connected between the first reference voltage source and a sixth node located between the eleventh switch and the fourth capacitor; and a fifteenth switch connected between the second reference voltage source and the fifth node; and a sixteenth switch connected between the third reference voltage source and the fifth node.

10. The analog to digital converter of claim 9, wherein the first and second comparators operate at about two times the speed of the operational amplifier.

* * * * *